United States Patent [19]

Coene et al.

[11] Patent Number: 5,753,913
[45] Date of Patent: May 19, 1998

[54] METHOD OF RECONSTRUCTING AN IMAGE IN A PARTICLE-OPTICAL APPARATUS

[75] Inventors: Willem M.J. Coene; Augustus J.E.M. Janssen, both of Eindhoven, Netherlands

[73] Assignee: U.S. Philips Corporation, New York, N.Y.

[21] Appl. No.: 723,652

[22] Filed: Oct. 3, 1996

[30] Foreign Application Priority Data

Oct. 3, 1995 [EP] European Pat. Off. ............ 95202648

[51] Int. Cl.⁶ ................................................ H01J 37/00
[52] U.S. Cl. ................................... 250/307; 250/311
[58] Field of Search ............................ 250/307, 311

[56] References Cited

U.S. PATENT DOCUMENTS

| | | | |
|---|---|---|---|
| 3,971,936 | 7/1976 | Hoppe | 250/311 |
| 5,134,288 | 7/1992 | Van Dijik | 250/311 |
| 5,353,236 | 10/1994 | Subbiah | 364/499 |
| 5,432,347 | 7/1995 | Coene | 250/311 |
| 5,466,937 | 11/1995 | Kruit | 250/311 |
| 5,523,568 | 6/1996 | Ichikawa et al. | 250/310 |
| 5,654,547 | 8/1997 | Coene et al. | 250/311 |

OTHER PUBLICATIONS

"Computer Techniques for Image Processing in Electron Microscopy", by W.O. Saxton, Chapter 9–7 Object Reconstruction, pp. 236–248, Academic Press, 1978.

*Primary Examiner*—Bruce Anderson
*Attorney, Agent, or Firm*—Anne E. Barschall

[57] ABSTRACT

A method of non-recursive reconstruction of images in a High Resolution Electron Microscope (HRTEM). In an HRTEM a series of, for example, 100 images of an object is formed with each time a different setting of the astigmatism of the imaging lens or lenses. By subjecting these images to a Fourier transformation and multiplying the transformed images by a known filter function, a reconstruction of the object electron wave function is obtained by summing of the images thus filtered and transformed; said object electron wave function no longer contains the linear information which is undesirable for the reconstruction and the non-linear information which is not negligibly small for large thicknesses of the object is no longer present either.

8 Claims, 2 Drawing Sheets

METHOD OF RECONSTRUCTING AN IMAGE IN A PARTICLE-OPTICAL APPARATUS

The invention relates to a method of deriving amplitude information and phase information of a particle wave function of an object to be studied in a particle-optical apparatus, which amplitude information and phase information are obtained by means of a number of images of the object formed in the particle-optical apparatus, in which method
(i) the images are picked up with mutually different values of an imaging parameter,
(ii) individual images are subjected to a Fourier transformation,
(iii) the transformed individual images are multiplied by a filter function which is characteristic of the imaging parameter and individual for each image, and
(iv) the products thus obtained are summed.

The invention also relates to a particle-optical apparatus comprising processor means for carrying out the method.

A method of this kind is known from the book series "Advances in Electronics and Electron Physics", notably from the supplement "Computer Techniques for Image Processing in Electron Microscopy", by W. O. Saxton, Chapter 9.7 "Object Reconstruction"; Academic Press, 1978.

As is known, the information concerning the microstructure of an object to be studied in a particle-optical apparatus is contained in the particle beam whereby the object is imaged on a detector (for example, a photographic film or a CCD camera) via the lenses provided in the particle-optical apparatus. The best known example of a particle-optical apparatus is the electron microscope, notably a High-Resolution Transmission Electron Microscope (HRTEM) in which the particle beam is formed by an electron beam. Because of the wave nature of the electrons in the beam, this information is described by means of a complex electron wave function $\phi(\bar{r})$ defining the phase and the amplitude of the electron wave as a function of the location vector $\bar{r}$ perpendicular to the beam in the object. Direct measurement of the electron wave function at the area of the object plane (the "object-electron wave function" cannot be performed in an HRTEM; instead the amplitude square distribution of the electron wave (i.e. the image) at the area of the detector is measured.

In an HRTEM the image resolution is degraded by lens defects (for example, spherical and chromatic aberration) and by spatial and temporal incoherence of the electron beam. The theoretical lower resolution limit is determined by the "diffraction" of the electron beam in the object, because the larger the deflection angle due to the diffraction, the higher the attenuation of the associated spatial frequencies in the object by destructive interference of the electron wave in the object will be, so that for large angles (i.e. small details) observation is no longer possible. The lower limit to be achieved in this manner is from 0.05 nm to 0.1 nm. In the absence of said electron-optical resolution limitations, said (theoretical) lower limit could be achieved.

From prior art attempts are known to circumvent the described limitations by utilizing image reconstruction. Several images of the object are then formed, one imaging parameter (for example, the focal distance of the imaging lens) being given a slightly different value for each image. By applying arithmetical operations to the series of images thus formed it is attempted to reconstruct the information present in the object electron wave function, so that more information can be obtained as regards details that cannot be directly observed thus far. Moreover, reconstruction offers the advantage that it also enables phase information concerning the object to be obtained, this is in principle not possible when the image is observed in the detector (photographic film or video camera).

Generally speaking, the reconstruction methods are classified in two groups, i.e. recursive methods and direct (so non-recursive) methods. Recursive reconstruction is to be understood to mean the repeated completion of a loop of arithmetical operations to be performed on one or more images, so that after each completion of the loop a better approximation of the original object electron wave function is available. Recursive reconstruction, however, has the drawback that such processes are calculate-intensive and that the convergence of such processes is generally slow.

The direct reconstruction methods do not have said drawbacks; in the case of a direct reconstruction method, notably the calculation process may commence immediately after the formation of the first image of a series of images. The known direct reconstruction methods, however, have other drawbacks, the most important of which is that given restrictions are imposed as regards the specimens to be studied.

According to the cited publication by Saxton a number of images is formed with different values of the focus setting of the imaging lens (a defocus series). Each of the image thus obtained is subjected to a Fourier transformation (FT), after which each transformed image is multiplied by an individual filter function. The images thus filtered are subsequently summed.

According to this known method the Fourier transformation is performed for the following reason. For the description of imaging by means of the interference theory of diffracted beams, the ultimate image (at the area of the detector) is assumed to be composed of contributions from interference between beams diffracted by the object and interference between the non-diffracted (through) beam and diffracted beams. The information produced in the image by the object electron wave function, therefore, contains a component which originates from the interference between diffracted beams themselves; this component is referred to as the non-linear information. The other component is due to the interference between the through beam and diffracted beams; this component is referred to as the linear information.

The linear part of the information itself is composed of a component arising from interference between the through beam and the beam produced by the first-order diffraction, and a component produced by interference between the through beam and the beam produced by the first-order diffraction. (First-order diffraction is to be understood to mean the diffraction at an angle with respect to the through beam which has the negative value of the angle of the first-order diffraction). The latter component is present in the image information, but may not contribute to the reconstruction of the object electron wave function so that it is referred to as undesirable linear information as opposed to the former component which is referred to as desired linear information. The non-linear component may not contribute to the reconstruction of the object electron wave function either, so that it is also undesirable.

Thus, for the reconstruction of the object electron wave function both undesirable components must be removed. The separation between the desirable and the undesirable linear information cannot be performed in real space by means of standard arithmetical operations. In order to enable such separation nevertheless, transformation to the frequency space takes place by Fourier transformation (frequency is to be understood to mean herein the spatial frequency of the details in the object), the spatial frequency being defined by the coordinate vector $\overline{G}=(G_x,G_y)$. In this space the two types of linear information can be simply separated from one another. The Fourier transformation is, therefore, a preparatory treatment enabling separation of the desirable from the non-desirable linear information, which separation is actually realized in a later stage of processing. The non-linear information cannot be removed in the described manner in the case of a defocus series.

For a defocus series the separation between the desirable linear information and the non-linear information cannot be realized in the described manner. In the above operations the non-linear information always produces residual information which is mixed with the desirable linear information, thus rendering the method described by Saxton unsuitable for specimens producing an object electron wave function with a non-negligibly small component of non-linear information in the images, i.e. thick specimens. In the context of HRTEM thick specimens are to be understood to mean specimens having a thickness greater than approximately 5 nm, for example a thickness of between 5 nm and 30 nm.

In the cited publication by Saxton each of the transformed individual images is multiplied by a filter function which is characteristic of the imaging parameter and individual per image. (See notably the formula (9.7.10) on page 244 of the cited publication.) This filter function is related to the transfer function of the electron microscope and may be considered as a modified version thereof. The transfer function is modified because of the fact that only a finite number of images is used to reconstruct the object electron wave function. (If the "normal" transfer function were used in this method instead of the filter function, the desirable linear information would still be mixed with residual undesirable linear information. This residue is filtered out by application of the filter function.) Via addition of the products of the transformed images and the filter functions, the undesirable linear information is averaged out to exactly zero, so that the desired separation is indeed achieved.

As has already been stated, the separation between the desirable linear information and the non-linear information cannot be realized by means of the described method, so that the known method is not suitable for thick specimens.

It is an object of the invention to provide a method for direct reconstruction of amplitude and phase information in the form of a particle wave function which is also suitable for thick specimens, thus enabling a more reliable reconstruction of the object to be studied.

To achieve this, the method in accordance with the invention is characterized in that said imaging parameter is astigmatism of the imaging lens.

In the context of the present invention astigmatism is to be understood to mean the first-order astigmatism, that is to say the astigmatism obtained by imparting a given strength to a basically round lens in a first plane through the axis of the lens and a deviating strength in a plane through the axis of the lens which extends perpendicularly to the first plane.

The desired object information is represented by the complex object electron wave function $\phi(\overline{r})$. The electron optical transfer is described by the transfer function $p(\overline{G};\overline{A})$ of the microscope, which function is dependent on the spatial frequency vector $\overline{G}$ and the astigmatism vector $\overline{A}=(A_1,A_2)$, in which $A_1$ and $A_2$ are the respective excitation strengths of the two astigmastism coils of the electron microscope. The spatial frequency $\overline{G}$ describes the two-dimensional space in the back focal plane of the imaging lens. This transfer function $p(\overline{G};\overline{A})$ is written as:

$$p(\overline{G};\overline{A})=p_1 \times p_2(\overline{G};A_1,A_2) \qquad (1)$$

Therein, $p_1$ represents inter alia the effect of the spherical aberration and the defocusing ($\Delta f$). The second part $p_2$ is responsible for the phase reconstruction by variation of the induced astigmatism; the presence of the first part $p_1$ is corrected for, after phase reconstruction, by simple deconvolution. The factor $p_2$ can be explicitly written as:

$$p_2(\overline{G};\overline{A})=exp\{-i\pi\lambda[A_1(G_x^2-G_y^2)+2A_2G_xG_y]\} \qquad (2)$$

in which the x-direction coincides with the main axis of the first stigmator coil ($A_1$). ($\lambda$ is the wavelength of the electron beam used for the image.) An image with astigmatism $\overline{G}$ is represented by $I(\overline{R};\overline{A})$, in which $\overline{R}$ is the two-dimensional location vector in the image or detector plane. The Fourier components of this image are represented by $I(\overline{G};\overline{A})$. The desired information of the object is obtained directly by combining the individual images in conformity with the below steps a), b) and c):

a) The individual images are subjected to a Fourier transformation, so that $I(\overline{R};\overline{A})$ is converted into $I(\overline{G};\overline{A})$.
b) For the electron-optical aberrations a direct correction is performed by means of the complex conjugate $p^*(\overline{G};\overline{A})$ of the transfer function $p(\overline{G};\overline{A})$, so that the product $I_p(\overline{G};\overline{A})$ arises:

$$I_p(\overline{G};\overline{A})=I(\overline{G};\overline{A})\times p^*(\overline{G};\overline{A}) \qquad (3)$$

c) The results obtained in step 2 are summed for the various values of the astigmatism vector $\overline{A}$; thus, the object electron wave function (in the Fourier space) $\phi(\overline{G})$ is obtained from the following equation:

$$\phi(\overline{G})\cdot\phi^*(\overline{G}=\overline{0})=\Sigma I_p(\overline{G};\overline{A}) \qquad (4)$$

summing taking place over all experimentally used values of the astigmatism vector $\overline{A}$, utilizing a normalization factor which is a measure of the total number of images. In order to determine $\phi^*(\overline{G}=\overline{0})$ (the complex conjugate of the through beam), the expression for the mean image intensity I is used:

$$I(\overline{G}=\overline{0})=\Sigma_i|\phi(\overline{G})|^2=|\phi(\overline{0})|^2+|\phi(\overline{0})|^{-2}\Sigma_j|\phi(\overline{G})\cdot\phi^*(\overline{0})|^2 \qquad (5)$$

in which $\Sigma_i$ indicates summing over all values of $\overline{G}$ and $\Sigma_j$ indicates summing over all values of $\overline{G}\neq\overline{0}$. The quantity $\phi(\overline{G})\cdot\phi^*(\overline{0})$ is determined by the expression (4) after phase reconstruction. Expression (5) then produces a simple square equation with the amplitude of the central beam $\phi(\overline{0})$ as its solution. The phase of the central beam may be chosen at random and is in this case assumed to be zero (as is usual). The desired information $\phi(\overline{G})$ is obtained from the expression (4) in combination with the solution for $\phi(\overline{0})$.

In a version of the method in accordance with the invention the result of the summing of said products is subjected to an inverse Fourier transformation.

If desired, the object electron wave function $\phi(\overline{G})$ in the Fourier space can be converted, by inverse Fourier transformation, into the object electron wave function $\phi(\overline{G})$ in real space, but in some cases this may be omitted because one is interested in this function in the Fourier space.

As has already been stated, the filter function is a modified form of the transfer function because of the fact that only a finite number of images is used for the reconstruction of the object electron wave function. The filter function filters out the undesirable linear information, but residual non-linear information remains because of the finite number of images. In order to minimize also the contribution made by the latter residue, in a further version of the method of the invention said products (of the Fourier transformed images and the filter functions) are summed with an individual weighting factor for each product, said weighting factor having the value one for a central part of the range of the astigmatism vectors used and a value which decreases quasi-continuously to zero for astigmatism vectors situated at the extremes of the range of these vectors. The extremes of said range is to be understood to mean the part in which the absolute values of the astigmatism vectors are maximum.

These and other aspects of the invention will be apparent from and elucidated with reference to the embodiments described hereinafter.

Figure 1:
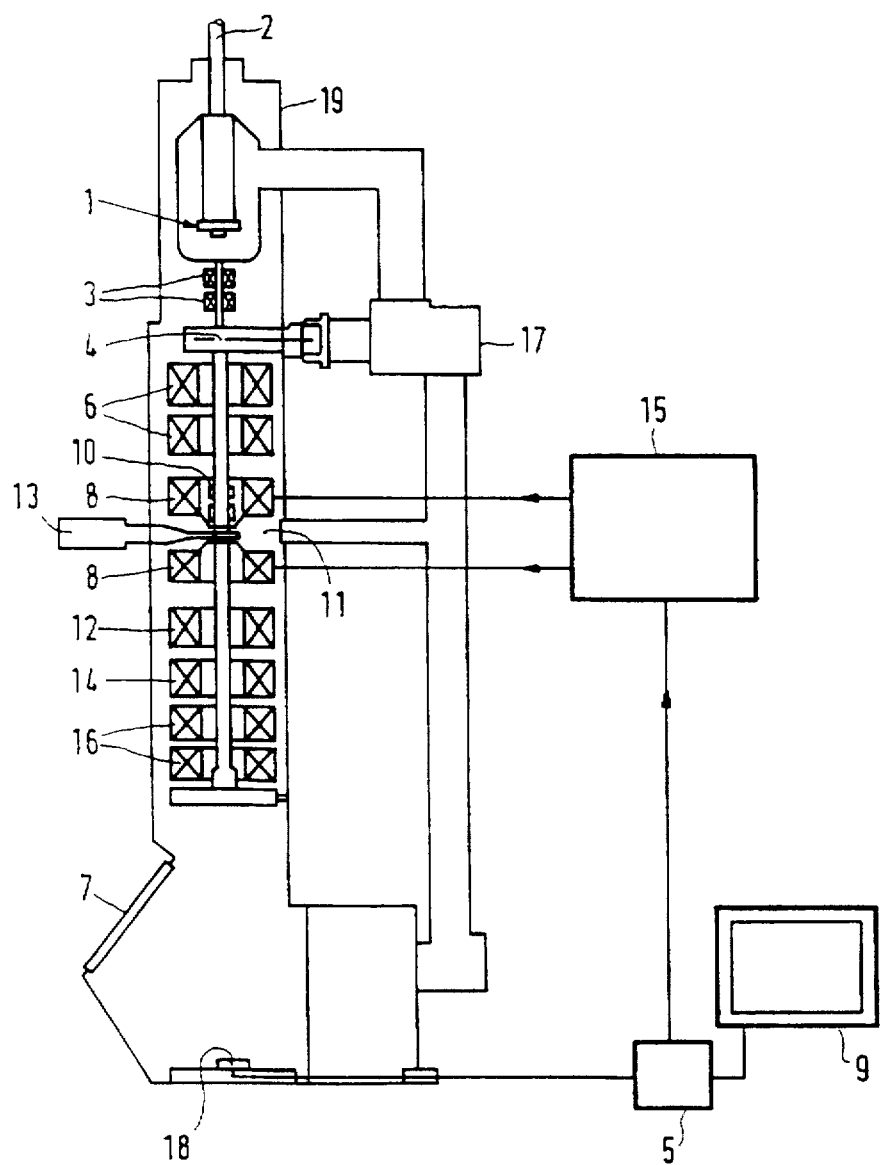
FIG. 1 shows an electron microscope suitable for carrying out the invention.

FIG. 1 shows a particle-optical apparatus in the form of an electron microscope. The apparatus comprises an electron source 1, a beam alignment system 3, a beam diaphragm 4, a condenser lens 6, an objective lens 8, a beam scanning system 10, an object space 11 in which an object carrier 13 is arranged, a diffraction lens 12, an intermediate lens 14, a projection lens 16 and an electron detector 18. The objective lens 8, the intermediate lens 14 and the projection lens 16 together form an imaging lens system. In or in the direct vicinity of the object lens 8 there are arranged two sets of stigmator coils (not shown in FIG. 1). In the known electron microscopes these stigmator coils serve to eliminate any residual astigmatism. In accordance with the invention, however, these coils are used to produce a desired degree of astigmatism. Said elements are accommodated in a housing 19 with an electric supply lead 2 for the electron source, a viewing window 7 and a vacuum pumping device 17. The excitation coils of the objective lens 8 are connected to an excitation unit 15 which is arranged to excite the imaging lens system and the stigmator coils under the control of an electronic control and processing unit 5. The electron microscope also comprises a recording unit which includes the electron detector 18, processor means which form part of the control and processing unit 5, and a display 9 for the observation of the images formed.

Figure 2:
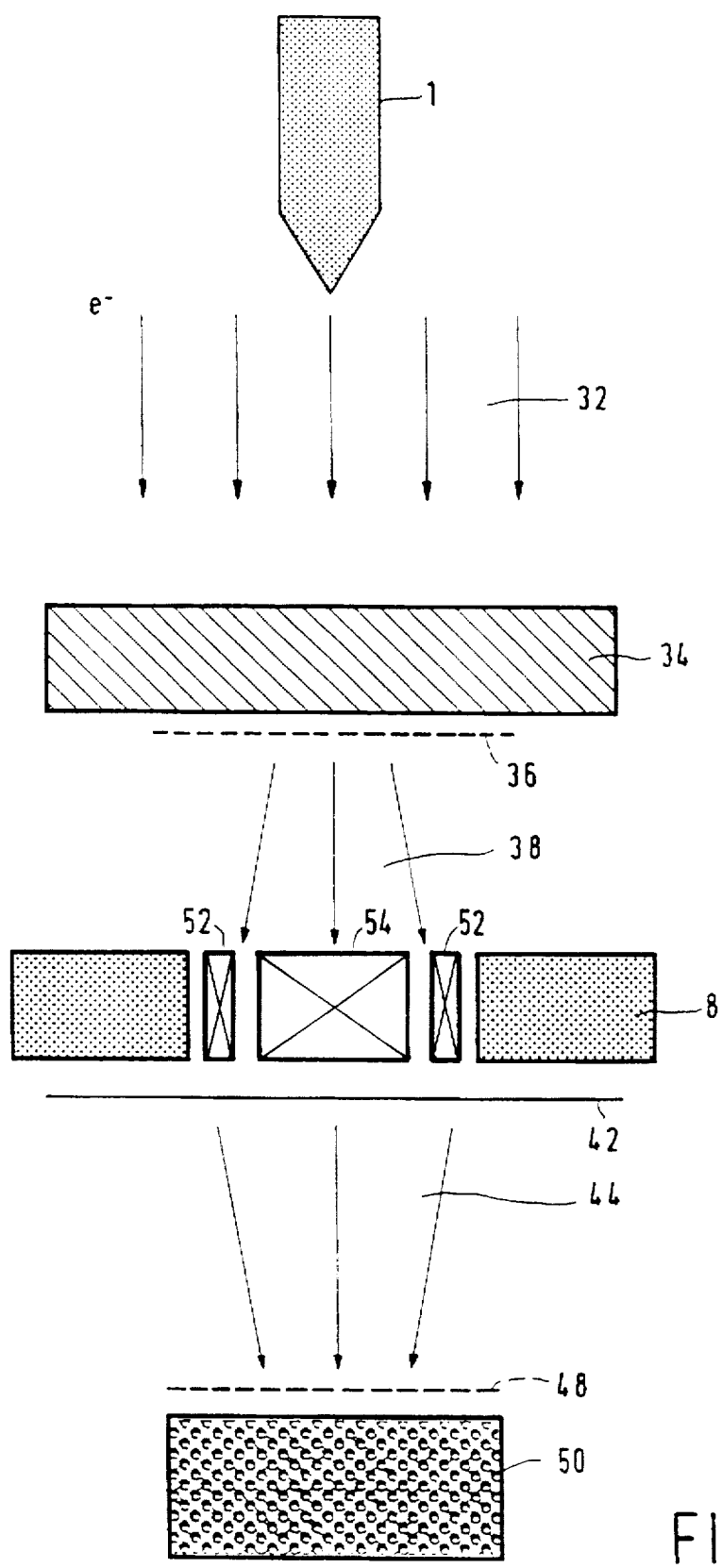
FIG. 2 shows a diagram illustrating the execution of the method of the invention in an electron microscope.

FIG. 2 shows a diagram illustrating the execution of the method in accordance with the invention in an electron microscope. The electron source 1 emits an electron beam which is diagrammatically represented by parallel arrows 32. This source may in principle be any type of source, such as a field emission source (Field Emission Gun or FEG) or a thermionic source such as the known $LaB_6$ source. The beam is incident on the object 34, so that information regarding its microstructure is present in the beam. Because of the wave nature of the electrons in the beam, this information is described by means of the complex electron wave function $\phi(\bar{r})$ (the object electron wave function) directly behind the object, so at the location 36 in the Figure. The location vector $\bar{r}$ denotes the location in the plane 36. The object wave $\phi(\bar{r})$ propagates as the electron wave 38 behind the object and is deflected further by the imaging lens system of the electron microscope (in this case symbolically represented by the objective lens 8). Because the structure of the object causes diffraction of the (parallel) wave incident on the object, the back focal plane 42 of the objective lens 8 contains a diffraction pattern which constitutes a representation of the spatial frequencies present in the object 34 and represented by the frequency vector $\bar{G}$, in which $G=\sigma/\lambda$, $\sigma$=the diffraction deflection angle in the object, and $\lambda$=the wavelength of the electron wave; because the deflection may occur in two independent directions, G has the nature of a vector: $\bar{G}$. Mathematically speaking this means that the object wave $\phi(\bar{r})$ in the real space is Fourier transformed to an object wave $\phi(\bar{G})$ in the frequency space. The description of the transfer of the object wave from the object to the detector (not shown) at the area of the image 50 takes place in known manner by means of a (complex) transfer function $p(\bar{G})$ in the frequency space in which the effect of lens aberrations is also taken into account. The imaging in the image plane 48 takes place by multiplying the object wave $\phi(\bar{G})$ by the transfer function $p(\bar{G})$ associated with the relevant setting of the electron microscope. This results in the image wave $\phi(\bar{G})$ in the frequency space wherefrom, if desired, the image wave $\phi(\bar{R})$ in the real space can be derived by an inverse Fourier transformation (the location vector $\bar{R}$ describes the position in the image plane 48). The square of the amplitude of this wave constitutes the probability distribution of the location of the electrons in the beam at the area of the detector, i.e. the image intensity I($\bar{R}$) in the image plane 48, so the image 50 which can be observed by the detector.

In the objective lens 8 there are provided two sets of stigmator coils 52 and 54 which are diagrammatically shown and serve to produce the desired astigmatism in such a manner that the astigmatism vector $\bar{A}=(A_1,A_2)$ has two mutually perpendicular components $A_1$ and $A_2$. If desirable, these coils may be replaced by a known equivalent, for example a unit for the electrostatic introduction of the astigmatism.

During execution of the method of the invention the coils 52 and 54 are appropriately excited so that a desirable degree of astigmatism is introduced into the image 50. For example, a series of 100 images is formed, each image exhibiting an astigmatism which deviates from that of the other images. Different astigmatism is to be understood to mean astigmatism which differs in respect of magnitude and/or direction, i.e. if the astigmatism vectors $\bar{A}_i$ and $\bar{A}_j$ differ. Each of the images formed with astigmatism is digitized so as to form an array of, for example 1,000×1,000 pixels which is subjected to a Fourier transformation, so that 100 Fourier transformed digital images are formed, each of which consists of an array of 1,000×1,000 complex elements. The filter functions which are known per se are also calculated in digital form. Each filter function is dependent on the astigmatism vector $\bar{A}=(A_1,A_2)$ and the spatial frequency vector $\bar{G}$; for a given value of $\bar{A}$, therefore, this function is dependent only on $\bar{G}$. If the number of pixels in the real space is chosen to be 1,000×1,000, the number of values for the spatial frequency vector in the frequency space must also be chosen as 1,000×1,000. As a result, the filter function is formed as an array of 1,000×1,000 complex elements. After digital computation of the filter function, one-to-one multiplication of each of the Fourier transformed digital images by each of the filter functions takes place. The digital products thus obtained are subsequently summed one-to-one, after which the result thus obtained can be divided, if desirable, by a normalization factor. The result then obtained, after correction also for the amplitude of the central beam $\phi(\bar{0})$ in conformity with the expression (5), constitutes the desired representation of the object electron wave function $\phi(\bar{G})$ in the Fourier space; if desired, the object electron wave function $\phi(\bar{r})$ in the real space can be derived therefrom by inverse Fourier transformation.

The steps of the above method can be executed in a computer program stored in a memory (not separately shown in the Figure) which forms part of the control and processing unit 5; this program can be executed by processor means (not separately shown in the Figure) which also form part of the control and processing unit 5.

We claim:

1. A method of deriving amplitude information and phase information of a particle wave function of an object to be studied in a particle-optical apparatus, which amplitude information and phase information are obtained by means of a number of images of the object formed in the particle-optical apparatus, in which method:
   i) the images are picked up with mutually different values of an imaging parameter,
   (ii) individual images are subjected to a Fourier transformation,
   (iii) the transformed individual images are multiplied by a filter function which is characteristic of the imaging parameter and individual for each image, and
   (iv) the products thus obtained are summed,
characterized in that said imaging parameter is astigmatism of the imaging lens.

2. A method as claimed in claim 1, in which the result of the summing of said products is subjected to an inverse Fourier transformation.

3. A method as claimed in claim 2, in which said products are summed with an individual weighting factor for each product, said weighting factor having the value one for a central part of the range of the astigmatism vectors used and a value which decreases quasi-continuously to zero for astigmatism vectors situated at the extremes of the range of these vectors.

4. A particle-optical apparatus comprising processor means for carrying out the method claimed in claim 3.

5. A particle-optical apparatus comprising processor means for carrying out the method claimed in claim 2.

6. A method as claimed in claim 1, in which said products are summed with an individual weighting factor for each product, said weighting factor having the value one for a central part of the range of the astigmatism vectors used and a value which decreases quasi-continuously to zero for astigmatism vectors situated at the extremes of the range of these vectors.

7. A particle-optical apparatus comprising processor means for carrying out the method claimed in claim 6.

8. A particle-optical apparatus comprising processor means for carrying out the method claimed in claim 1.

* * * * *